US008792726B2

(12) United States Patent
Watanabe et al.

(10) Patent No.: US 8,792,726 B2
(45) Date of Patent: Jul. 29, 2014

(54) GEOMETRIC FEATURE EXTRACTING DEVICE, GEOMETRIC FEATURE EXTRACTING METHOD, STORAGE MEDIUM, THREE-DIMENSIONAL MEASUREMENT APPARATUS, AND OBJECT RECOGNITION APPARATUS

(75) Inventors: Daisuke Watanabe, Yokohama (JP); Kazuhiko Kobayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 56 days.

(21) Appl. No.: 13/575,994

(22) PCT Filed: Mar. 9, 2011

(86) PCT No.: PCT/JP2011/056134
§ 371 (c)(1),
(2), (4) Date: Jul. 30, 2012

(87) PCT Pub. No.: WO2011/115143
PCT Pub. Date: Sep. 22, 2011

(65) Prior Publication Data
US 2012/0294534 A1 Nov. 22, 2012

(30) Foreign Application Priority Data

Mar. 16, 2010 (JP) .................................. 2010-059923

(51) Int. Cl.
*G06K 9/46* (2006.01)
*G06K 9/66* (2006.01)

(52) U.S. Cl.
USPC .......................................... 382/195; 382/154

(58) Field of Classification Search
USPC .................. 382/195, 199, 203, 154
See application file for complete search history.

(56) References Cited

U.S. PATENT DOCUMENTS 6,504,957 B2   1/2003   Nguyen et al.
6,600,485 B1   7/2003   Yoshida et al.

(Continued)

FOREIGN PATENT DOCUMENTS

JP   2002-178576 A   6/2002
JP   2004-271222 A   9/2004

(Continued)

OTHER PUBLICATIONS

P.J. Besl et al., "A Method for Registration of 3-D Shapes," IEEE Transactions on Pattern Analysis and Machine Intelligence, vol. 14, No. 2, pp. 239-256, 1992.

(Continued)

*Primary Examiner* — Gregory M Desire
(74) *Attorney, Agent, or Firm* — Fitzpatrick, Cella, Harper & Scinto (57) ABSTRACT

A geometric feature extracting device comprising: first input means for inputting a three-dimensional shape model of a measurement object; generation means for generating two-dimensional parameter planes corresponding to curved surface patches that configure the three-dimensional shape model; first calculation means for calculating normal directions to points on the curved surface patches; holding means for holding the parameter planes and the normal directions in association with each other; second input means for inputting an observation direction used to observe the measurement object from an observation position; selection means for selecting regions in each of which the normal direction and the observation direction satisfy a predetermined angle condition from the parameter planes; and second calculation means for calculating geometric features on three-dimensional shape model corresponding to regions selected by the selection means as geometric features that configure geometric feature regions on the three-dimensional shape model, which are observable from the observation position.

10 Claims, 8 Drawing Sheets

(56) References Cited

U.S. PATENT DOCUMENTS

| | | |
|---|---|---|
| 6,879,323 B1 * | 4/2005 | Nagai et al. .................. 345/420 |
| 8,429,174 B2 * | 4/2013 | Ramani et al. ................ 707/749 |
| 8,442,304 B2 * | 5/2013 | Marrion et al. ............... 382/154 |
| 2010/0156896 A1 * | 6/2010 | Ichimura et al. ............. 345/419 |
| 2012/0033071 A1 | 2/2012 | Kobayashi et al. |
| 2012/0262455 A1 | 10/2012 | Watanabe et al. |
| 2012/0268567 A1 | 10/2012 | Nakazato et al. |
| 2012/0294534 A1 * | 11/2012 | Watanabe et al. ............. 382/195 |

FOREIGN PATENT DOCUMENTS

| | | |
|---|---|---|
| JP | 2007-164557 A | 6/2007 |
| WO | 00/02165 A | 1/2000 |

OTHER PUBLICATIONS

Y. Chen et al., "Object Modeling by Registration of Multiple Range Images," Proc. IEEE Conference on Robotics and Automation, 1991.

P.J. Besl, "Surfaces in Range Image Understanding", Springer-Verlag, pp. 63-115 (1988).

* cited by examiner

UV PARAMETER SPACE

FIG. 5B

UV NORMAL MAP

GEOMETRIC FEATURE EXTRACTING DEVICE, GEOMETRIC FEATURE EXTRACTING METHOD, STORAGE MEDIUM, THREE-DIMENSIONAL MEASUREMENT APPARATUS, AND OBJECT RECOGNITION APPARATUS

TECHNICAL FIELD

The present invention relates to a geometric feature extracting device, which extracts geometric features from, for example, a parametric shape model which depends on an observation direction, a geometric feature extracting method, and a storage medium, and also to a three-dimensional measurement apparatus and object recognition apparatus, which include the geometric feature extracting device.

BACKGROUND ART

As a method of executing recognition or position/orientation measurement processing from an image of a measurement object included in a grayscale image or range image, Model-Based Vision is known. The range image is an image in which each pixel has depth information. This method calculates correspondences between geometric features detected from a captured image and those extracted from a three-dimensional shape model of a measurement object, and estimates the recognition or position/orientation measurement parameters to have distances between the correspondences as an evaluation function. This technique requires the three-dimensional shape model of the measurement object beforehand. A method which diverts design data of CAD software as this three-dimensional shape model is called CAD-Based Vision.

In general, CAD data which expresses the shape of an object is normally expressed by a parametric shape model. The parametric shape model expresses a shape by combining a plurality of parametric curved surfaces such as B-Spline curved surfaces or NURBS (Non-Uniform Rational B-Spline) curved surfaces. Since the parametric curved surface defines a curved surface by a combination of a basis function and parameters, it can express a complicated curved surface shape by a small information amount as its advantage. Therefore, when the parametric shape model, which compactly holds shape information, is used at the time of design in the recognition or position/orientation measurement processing of an object, geometric features on the model can be calculated with high accuracy, thus attaining accurate processing.

For example, P. J. Besl and N. D. McKay, "A method for registration of 3-D shapes," IEEE Transactions on Pattern Analysis and Machine Intelligence, vol. 14, no. 2, pp. 239-256, 1992 discloses an Iterative Closest Point (ICP) algorithm as a method of estimating the position and orientation of a target object from a captured range image using a parametric shape model. More specifically, the following method is disclosed. That is, the position and orientation of an object are estimated by fitting a three-dimensional shape model of the object into three-dimensional point cloud data converted from a range image. Based on approximate values of the position and orientation, geometric features of the shape model, which are closest to respective three-dimensional points, are searched, and update processing of the position and orientation is repeated to minimize the sum total of distances between the points and geometric features of the shape model.

In general, since the parametric shape model requires complicated geometric operations and product-sum operations using a plurality of parameters, a long time period is required for calculations carried out when geometric features on curved surfaces are to be sequentially searched. For this reason, a long processing time is required when correspondences between the parametric shape model and captured image are calculated. For example, in the aforementioned registration method using the parametric shape model (see P. J. Besl and N. D. McKay, "A method for registration of 3-D shapes," IEEE Transactions on Pattern Analysis and Machine Intelligence, vol. 14, no. 2, pp. 239-256, 1992), correspondences between the three-dimensional point cloud converted from the range image and geometric features on the parametric shape model are calculated. In this case, the geometric features on the parametric curved surfaces have to be sequentially searched. Upon sequentially searching the geometric features, a long processing time is required to calculate the coordinates and normals of points on the parametric curved surfaces. Therefore, such long processing time adversely influences a response time in real-time processing that executes three-dimensional measurements using correspondences with a captured image.

Also, U.S. Pat. No. 6,504,957 discloses a method to extract regions where geometric features are easily detected in a captured image from a shape model in advance. With this method, as regions where measurement tends to be stable on the captured image, those having small curvatures on the shape model are extracted as geometric features. However, this method does not consider the position and orientation of an image capturing device with respect to a measurement object. Geometric features such as edges and planes which are associated with each other between the shape model and captured image largely change depending on the observation direction of the measurement object, that is, the position and orientation of the image capturing device with respect to the measurement object. For this reason, the method described in U.S. Pat. No. 6,504,957 impairs the accuracy of extracted geometric features when the image capturing device is located at a slant position with respect to the measurement object.

Furthermore, Japanese Patent Laid-Open No. 2002-178576 discloses a method to speed up calculations of geometric features on a model by parameter-converting a parametric shape model into simple equivalent curved surfaces. However, this method aims to render the parametric shape model at high speed, and it consequently requires sequential search processing so as to calculate correspondences with measurement points.

In consideration of the aforementioned problems, the present invention provides a technique for efficiently calculating geometric features required to use correspondences with a captured image based on an observation direction of an object in recognition or position/orientation measurement processing of the object using a parametric shape model.

SUMMARY OF INVENTION

According to one aspect of the present invention, there is provided a geometric feature extracting device comprising: first input means for inputting a three-dimensional shape model of a measurement object; generation means for generating two-dimensional parameter planes corresponding to curved surface patches that configure the three-dimensional shape model; first calculation means for calculating normal directions to points on the curved surface patches; holding means for holding the parameter planes and the normal directions in association with each other; second input means for inputting an observation direction used to observe the measurement object from an observation position; selection means for selecting regions in each of which the normal direction and the observation direction satisfy a predetermined angle condition from the parameter planes; and second calculation means for calculating geometric features on the three-dimensional shape model corresponding to the regions selected by the selection means as geometric features that configure geometric feature regions on the three-dimensional shape model, which are observable from the observation position.

According to the present invention, geometric features can be extracted from a parametric shape model at high speed in accordance with an observation direction.

Further features of the present invention will be apparent from the following description of exemplary embodiments with reference to the attached drawings.

DESCRIPTION OF EMBODIMENTS

An exemplary embodiment(s) of the present invention will now be described in detail with reference to the drawings. It should be noted that the relative arrangement of the components, the numerical expressions and numerical values set forth in these embodiments do not limit the scope of the present invention unless it is specifically stated otherwise.

First Embodiment

The first embodiment will explain the following case. That is, normal maps are generated in correspondence with respective curved surface patches of a three-dimensional shape model and, especially, a parametric shape model. Then, geometric features on the model are extracted at high speed based on an observation direction of a measurement object from an observation position and the normal maps, and the extracted geometric features and a captured range image are associated with each other, thereby measuring the position and orientation of the object.

Figure 1:
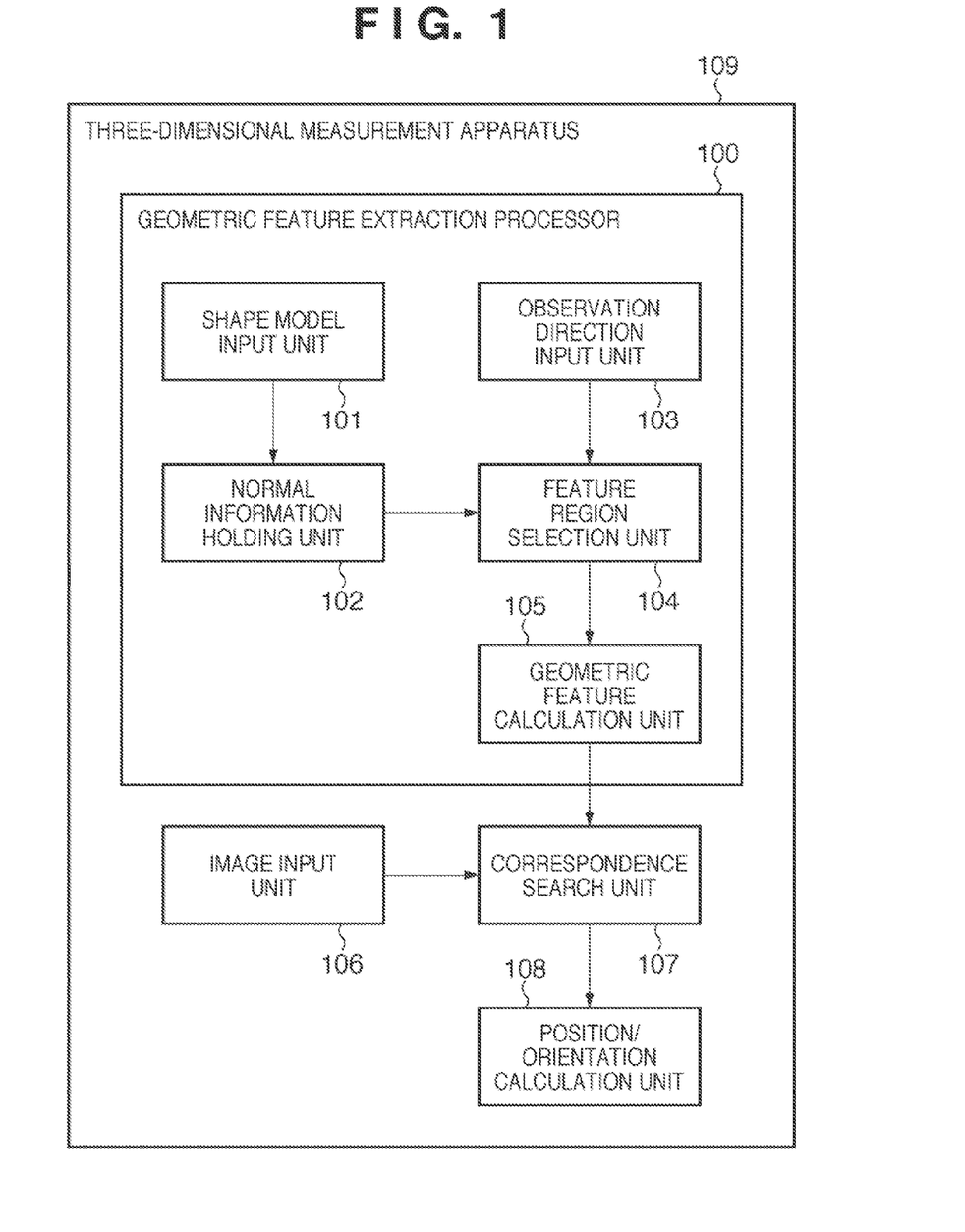
FIG. 1 is a block diagram showing the arrangement of a geometric feature extraction processor 100 and a three-dimensional measurement apparatus 109 according to the first embodiment.

The arrangement of a geometric feature extraction processor 100 and three-dimensional measurement apparatus 109 according to the first embodiment will be described below with reference to FIG. 1. As shown in FIG. 1, the geometric feature extraction processor 100 includes a shape model input unit 101, normal information holding unit 102, observation direction input unit 103, feature region selection unit 104, and geometric feature calculation unit 105. The three-dimensional measurement apparatus 109 includes the geometric feature extraction processor 100, an image input unit 106, a correspondence search unit 107, and a position/orientation calculation unit 108. Arithmetic operations of the respective processing units are executed by, for example, a CPU (not shown). The respective processing units which configure the geometric feature extraction processor 100 and three-dimensional measurement apparatus 109 will be described below.

Figure 4A:
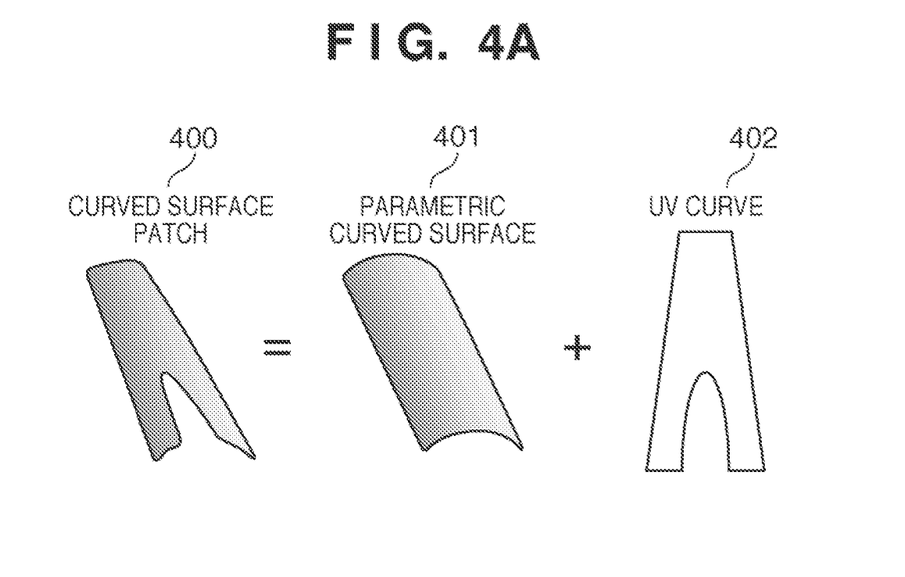
FIGS. 4A and 4B are views of a curved surface patch which configures a parametric shape model according to the first embodiment.

The shape model input unit 101 inputs a parametric-expressed model which expresses the shape of a measurement object. Note that the parametric expression is a method which expresses, letting u and v be two parameters which move around in a region in a uv plane, the coordinates (x, y, z) of a point P on a three-dimensional space by three continuous functions x=f(u, v), y=g(u, v), and z=h(u, v). As shown in FIG. 4A, a curved surface patch 400, which configures the parametric shape model, is defined by a parametric curved surface 401 used as a base curved surface and a uv curve 402. Note that the uv curve 402 expresses a valid region on the parametric curved surface 401 by a contour on the uv plane. This embodiment uses a B-Spline curved surface as the parametric curved surface 401 used as a base curved surface.

Figure 4B:
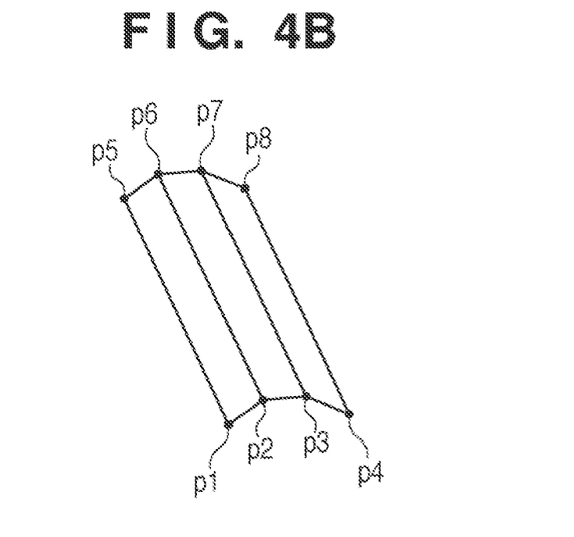

Each B-Spline curved surface is defined by n×m control point sequences which are arranged in a grid pattern corresponding to the uv plane, and knot sequences in a u direction (n+p knots) and in a v direction (m+q knots). For example, as shown in FIG. 4B, p1, p2, . . . , p8 indicate control points which define the parametric curved surface 401 (B-Spline curved surface) as a base curved surface of the curved surface patch 400 shown in FIG. 4A. However, the parametric curved surface 401 used as a base curved surface need only be a curved surface used to execute mapping from the two-dimensional parameters (u, v) into three-dimensional coordinates (x, y, z). That is, the parametric curved surface 401 may be any of a Besier curved surface, NURBS (Non-Uniform Rational B-Spline) curved surface, and analysis curved surface. Alternatively, the parametric curved surface 401 may be a curved surface obtained by converting a polygon model into the aforementioned parametric curved surface 401. Furthermore, one curved surface patch 400 is expressed using the uv curve 402 which defines, using the uv plane, a valid region on the parametric curved surface 401 as the base curved surface. The uv curve 402 is configured by one closed curve having a direction, and defines, as a valid region on the curved surface, a region which exists on the left side thereof when a point moves on the uv plane along the closed curve.

The normal information holding unit 102 generates normal map images corresponding to respective curved surface patches which configure the parametric shape model. More specifically, the normal information holding unit 102 generates a two-dimensional image which holds three values per pixel, and considers this image as a parameter space (parameter plane) of u and v corresponding to each curved surface patch. Then, the normal information holding unit 102 calculates a normal $(nx, ny, nz)^T$ to a point on the three-dimensional parametric curved surface for each pixel (u, v) on the image. Furthermore, the normal information holding unit 102 generates a normal map image by holding the three values of the calculated normal $(nx, ny, nz)^T$ in the corresponding pixel (u, v) on the two-dimensional image. The normal map image of each curved surface generated in this case is used when the feature region selection unit 104 selects a region used as a valid geometric feature on an observation image. The need for normal calculations in a run-time can be obviated by aggregating three-dimensional normal vectors of curved surface patches on two-dimensional normal maps.

The observation direction input unit 103 inputs a direction of an image capturing device, which captures an image of the measurement object, with respect to the measurement object. In this case, the direction of the image capturing device with respect to the measurement object represents an approximate position and orientation of the measurement object with reference to a coordinate system of the image capturing device. In this embodiment, the position and orientation of the measurement object with reference to the image capturing device are accurately measured using geometric features on the model extracted to have the input approximate position and orientation as a clue. Therefore, the approximate position and orientation need only be a rough position and orientation of the measurement object with respect to the image capturing device. Note that the position and orientation are continuously measured in the time axis direction, and the previous measurement results (at a previous time) of the approximate position and orientation are used as the observation direction of the measurement object at the current time. However, the input method of the observation direction of the measurement object is not limited to this. For example, the motion velocity or angular velocity of an object may be estimated from previous measurement values by time-series filtering processing such as a linear filter or Kalman filter, and the observation direction of the measurement object at the current time may be predicted based on the estimated motion velocity or angular velocity. When it is possible to measure the observation direction of the measurement object using another sensor, the output value of that sensor may be used as the observation direction of the measurement object. The sensor may be, for example, a magnetic sensor which measures an orientation by detecting a magnetic field generated by a transmitter by a receiver attached to an object. In addition, any other sensors may be used as long as they measure an approximate position and orientation of an object. When a rough position and orientation where the measurement object is placed are detected in advance, these values may be used. Alternatively, an observation direction of the measurement object may be estimated using an object recognition technique from an image obtained by capturing a scene including the measurement object or a range image. The observation direction of the measurement object input by the observation direction input unit 103 is used by the feature region selection unit 104.

The feature region selection unit 104 compares a visual line vector, which is calculated from the observation direction from the observation position input by the observation direction input unit 103, with the normal to each curved surface patch held by the normal information holding unit 102. Then, the feature region selection unit 104 determines feature regions on the model, which are observable on an observation image, on the uv plane.

The geometric feature calculation unit 105 calculates geometric features of corresponding parametric curved surfaces with respect to the regions on the uv plane, which are selected by the feature region selection unit 104. More specifically, the geometric feature calculation unit 105 calculates three-dimensional coordinates (x, y, z) of a point on a corresponding curved surface from the two-dimensional parameters (u, v) as coordinates which configure a geometric feature region on the three-dimensional shape model. Alternatively, the geometric feature calculation unit 105 may hold three-dimensional coordinates (x, y, z), which are calculated from the two-dimensional parameters (u, v) in advance, in a table, and may look up that table.

The aforementioned processing units execute processes associated with geometric feature extraction. In order to calculate the position and orientation of the object from an actual range image using the processing units of this embodiment, the image input unit 106, correspondence search unit 107, and position/orientation calculation unit 108 are used.

The image input unit 106 is a distance sensor used to capture a range image. The range image is an image in which each pixel has depth information. The distance sensor can adopt an active method which captures, using a camera, reflected light of laser or slit light with which a target is irradiated, and measuring a distance by triangulation. However, the distance sensor is not limited to this, and may adopt a Time-of-flight method using a flight time of light. Also, the distance sensor may adopt a passive method which calculates the depth of each pixel by triangulation from images captured by a stereo camera. In addition, no other sensors impair the gist of the present invention as long as they measure a range image.

The correspondence search unit 107 associates geometric features on an image input by the image input unit 106 with those calculated by the geometric feature calculation unit 105. As a practical geometric feature association method, for example, a method introduced by [Chen, Y. and Medioni, G. "Object Modeling by Registration of Multiple Range Images," Proc. IEEE Conf. on Robotics and Automation, 1991] is available. A search may be conducted from the point calculated using this method in a normal direction to calculate an intersection with a mesh obtained by connecting measurement points of a range image, thereby associating the intersection with the point. Alternatively, a calculated geometric feature may be projected based on the approximate position and orientation, and the geometric feature, which is projected onto the same pixel as a measurement point on a range image, may be associated with the point. Also, a search may be conducted for the calculated point in a normal direction on a three-dimensional space, and intersection determination with a mesh of a range image may be executed to use a correspondence intersecting with the mesh.

The position/orientation calculation unit 108 estimates the position and orientation of the measurement object using pairs of the geometric features of the shape model and those on the range image, which are associated with each other by the correspondence search unit 107. As a method of calculating the position and orientation of the measurement object, differences between the positions on the three-dimensional space of the associated pairs of geometric features of the shape model and those on the range image are minimized by iterative optimization. Note that the image input unit 106, correspondence search unit 107, and position/orientation calculation unit 108 described in this embodiment are examples, and a combination with registration processing using a range image and model may be used.

Since the geometric feature extracting device according to the present embodiment can extract geometric features at high speed according to the observation direction, the position and orientation can also be measured at high speed.

The flowchart showing the processing sequence for extracting geometric features from the parametric shape model of the measurement object according to the first embodiment will be described below with reference to FIG. 2.

In step S201, the shape model input unit 101 inputs the parametric shape model of the measurement object. In this embodiment, assume that the model is expressed by a plurality of B-Spline curved surface patches.

Figure 3A:
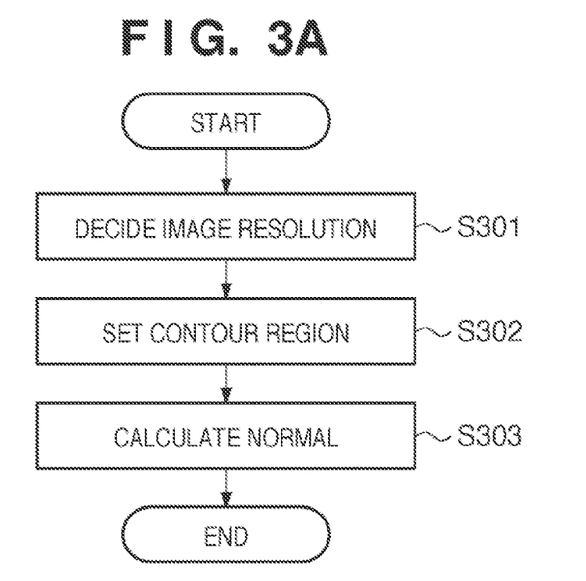
FIG. 3A is a flowchart showing the sequence of normal map generation processing according to the first embodiment.

In step S202, normal map images are generated in correspondence with the respective curved surface patches of the parametric shape model. FIG. 3A is a flowchart for explaining the sequence of normal map generation processing in step S202. Respective processes will be described below.

In step S301, images which express uv planes corresponding to the respective curved surface patches are respectively generated. At this time, according to the scales of the respective curved surface patches on the model, a uv plane having a high resolution is generated for a patch having a large area on the model, and a uv plane having a low resolution is generated for a patch having a small area on the model, so that geometric features on the model have uniform densities. More specifically, assume that a uv parameter space which expresses each curved surface patch is normalized to $0 \le u \le 1$ and $0 \le v \le 1$. For example, assume that points of four corners of a uv plane correspond to the control points shown in FIG. 4B, which define the base curved surface (parametric curved surface 401) shown in FIG. 4A. That is, assume that the control points corresponding to (u, v)=(0, 0), (0, 1), (1, 1), and (1, 0) are respectively p1=(x1, y1, z1), p4=(x4, y4, z4), p8=(x8, y8, z8), and p5=(x5, y5, z5). At this time, an image resolution ratio U:V of uv planes which express the respective curved surface patches is decided as:

$$U:V = \|p_1 - p_5\| + \|p_4 - p_9\| : \|p_1 - p_4\| + \|p_8 - p_5\| \quad (1)$$

However, the image resolution decision method may use, for example, points on a curved surface corresponding to the four corners of the uv plane in place of the control points, or all the uv planes may have the same resolution. In addition, any other image resolution decision methods may be used.

Figure 5A:
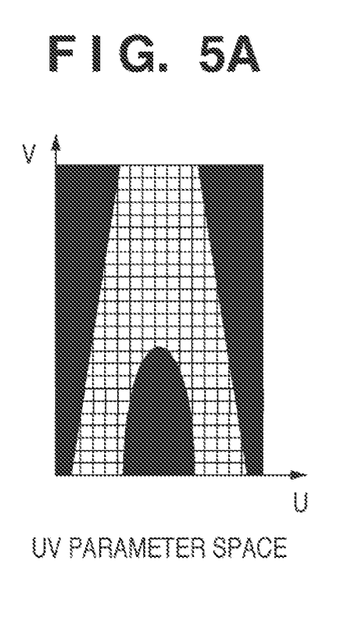
FIGS. 5A and 5B are views of a uv parameter space and normal map corresponding to a curved surface patch which configures the parametric shape model according to the first embodiment.

In step S302, a contour of each curved surface patch is drawn on the image which expresses the uv plane of that curved surface patch, thus setting a valid region of the parametric curved surface 401, as shown in FIG. 5A. More specifically, after image coordinates are normalized to $0 \le u \le 1$ and $0 \le v \le 1$, the uv curve 402 as a contour of the curved surface patch 400 is drawn on the uv plane. At this time, assuming that the uv curve 402 having a direction goes on the uv plane, a region which exists on the left side of the uv curve 402 is set as a valid region, and that which exists on the right side is set as an invalid region. Then, in order to indicate an invalid region for respective pixels which belong to the invalid region, a norm of three values in a normal is "1", while three values="0" to be stored in each pixel are recorded to be distinguished from the former value.

Figure 5B:
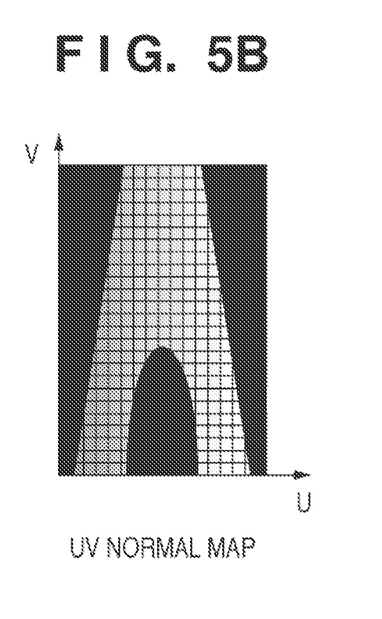

In step S303, a normal to a point p on the corresponding curved surface patch on the model coordinate system is calculated for each pixel (u, v) of the uv plane determined as a valid region in step S302, and is registered in association with the pixel (u, v). More specifically, when a normal to a point on each corresponding curved surface is expressed by $n(u, V) = (nx, ny, nz)^T$ for each pixel (u, v), n(u, v) is calculated by:

$$n(u, v) = \frac{\partial \psi}{\partial u} \times \frac{\partial \psi}{\partial v} = \frac{\partial}{\partial u}\psi(u, v) \times \frac{\partial}{\partial v}\psi(u, v) \quad (2)$$

where $\psi = \psi(u, v)$ expresses the coordinates (x, y, z) of the point p on a curved surface corresponding to the parameters (u, v). Note that the calculated normal vector n(u, v) is normalized as a unit normal vector to have a norm=1. Then, the three values of $n(u, v) = (nx, ny, nz)^T$ calculated using equation (2) are held in association with the pixel (u, v). More specifically, for example, pixel values (r, g, b) of that pixel (u, v) are equated to r=nx, g=ny, and b=nz based on the calculated unit normal vector $(nx, ny, nz)^T$. After that, these values are held as a UV normal map shown in FIG. 5B. However, the normal holding method for respective pixels is not limited to this. For example, only pixels of a uv plane determined as a valid region on each curved surface are extracted, and are held in a table in association with normal vectors n(u, v) for respective pixels.

In this embodiment, a valid region of each curved surface is expressed by a uv plane in advance, and a normal vector is calculated in advance in association with each pixel (u, v). As a result, since valid region determination of curved surfaces using contours and normal calculations need not be executed in real time, the processing can be speeded up.

Figure 2:
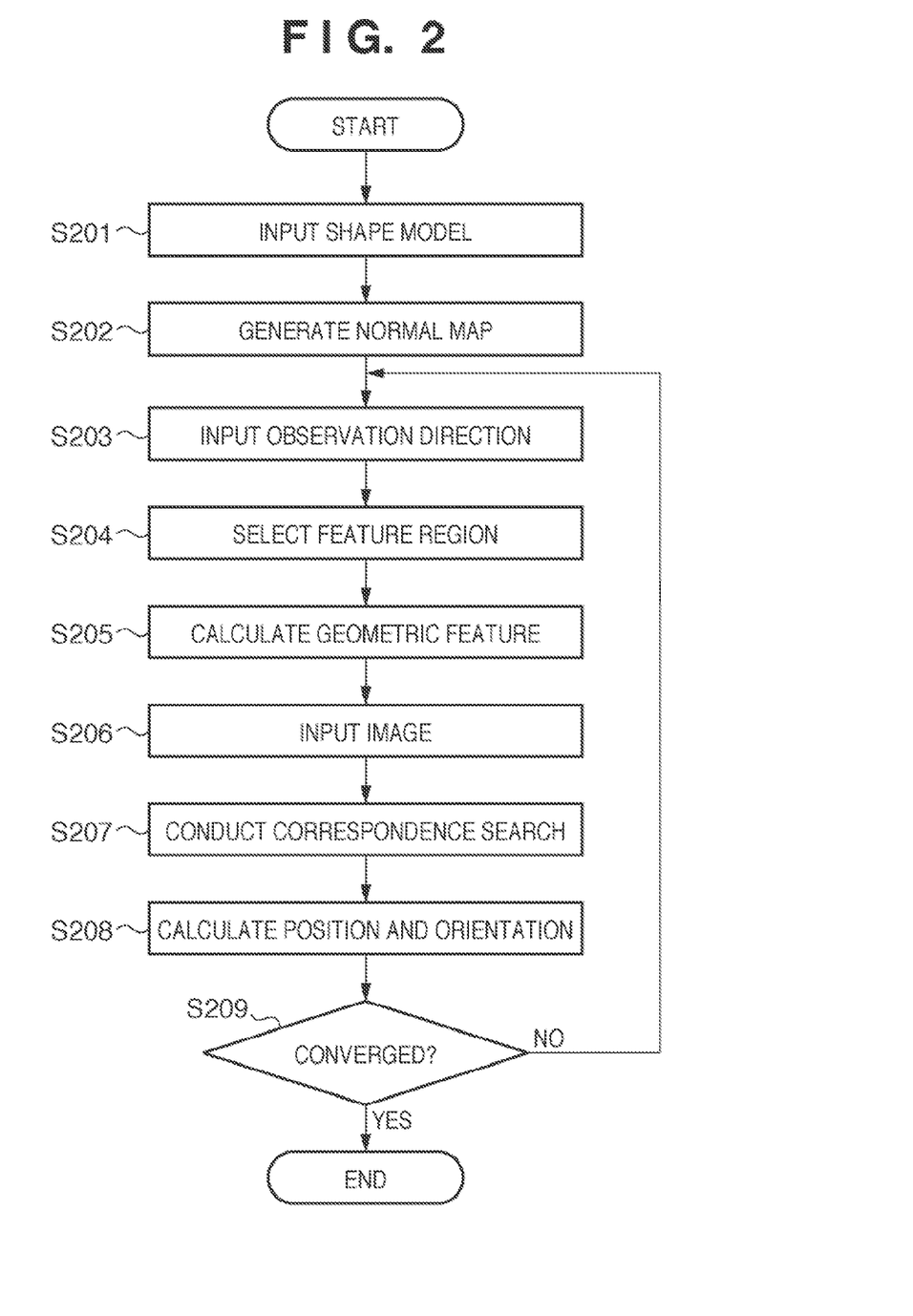
FIG. 2 is a flowchart showing the sequence of geometric feature extracting processing from a parametric shape model according to the first embodiment.

After the normal maps are generated, the control returns to the flowchart of FIG. 2. In step S203, the observation direction input unit 103 inputs the observation direction of the measurement object to the geometric feature extraction processor 100. As described above, as approximate values of the position and orientation of an object, the position and orientation measured at a previous time can be used. Alternatively, predicted values of the position and orientation, which consider motion estimation results such as a motion or angular velocity, measurement values of another sensor, an object recognition result from a two-dimensional image or range image, and so forth can be used. This embodiment uses the position and orientation measured at the previous time.

Figure 3B:
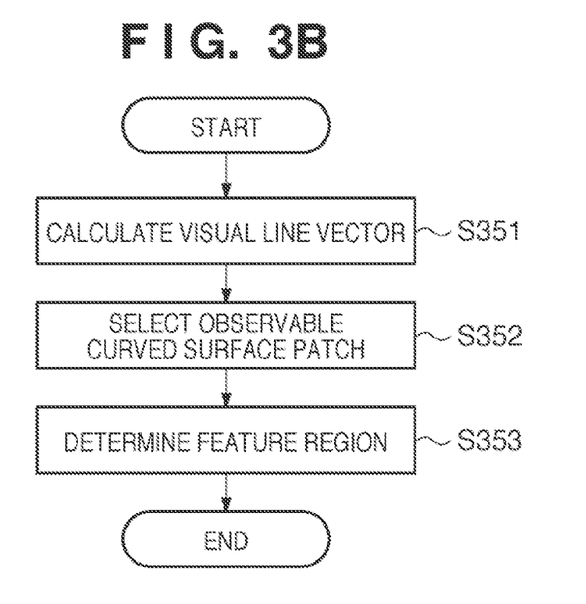
FIG. 3B is a flowchart showing the sequence of geometric feature extracting processing according to the first embodiment.

In step S204, regions used as geometric features are selected from the parametric shape model based on the observation direction of the measurement object input in step S203 and the normal maps generated in step S202. The flowchart showing the geometric feature region selection processing sequence in step S204 will be described below with reference to FIG. 3B.

In step S351, a visual line vector (observation direction vector) $e = (ex, ey, ez)^T$ of the image capturing device is calculated based on the observation direction and intrinsic parameters (focal length, principal point position) of the image capturing device. Note that the visual line vector is a vector which indicates a direction with respect to an image center of a captured image with reference to the coordinate system of the image capturing device. This visual line vector $e = (ex, ey, ez)^T$ is converted using a conversion matrix R including rotation components r11 to r33 and translation components tx, ty, and tz. More specifically, a visual line vector $e' = (ex', ey', ez')^T$, which is converted from the coordinate system expression of the image capturing device into that of the parametric shape model, is calculated by:

$$\begin{pmatrix} e' \\ 1 \end{pmatrix} = R \begin{pmatrix} e \\ 1 \end{pmatrix} = \begin{pmatrix} r_{11} & r_{12} & r_{13} & t_x \\ r_{21} & r_{22} & r_{23} & t_y \\ r_{31} & r_{32} & r_{33} & t_z \\ 0 & 0 & 0 & 1 \end{pmatrix} \begin{pmatrix} e \\ 1 \end{pmatrix} \quad (3)$$

Note that the visual line vector e' converted into the model coordinate system expression is normalized to have a norm=1. However, in place of converting the visual line vector into the parametric shape model coordinate system, the normals of the normal maps may be converted into the coordinate system of the image capturing device.

In step S352, observable curved surface patches are selected. That is, from all the curved surface patches that configure the parametric shape model, those which are not observed from the input observation direction due to self occlusion are culled, and only those which are observed on a captured image are selected. More specifically, as offline processing, parametric curved surface models are rendered from a large number of directions, and only observable curved surface patches in respective directions are registered in association with the directions. Then, in online processing, a direction closest to the visual line vector calculated in step S351 is selected from the registered directions, and curved surface patches registered in association with the selected direction are selected. However, the selection method of observable curved surface patches on a captured image is not limited to this. For example, for images obtained by rendering the parametric curved surface models, normal maps of the respective curved surface patches on which self-occluded pixel regions are registered with reference to the depth map may be held in correspondence with directions.

In step S353, for the respective normal maps of the curved surface patches selected in step S352, the inner products of the normal vectors n of pixels (u, v) set as valid regions in step S302 in the normal maps and the visual line vector e' calculated in step S351 are calculated. Then, geometric feature regions observed on the model in the input observation direction are determined.

Figure 6A:
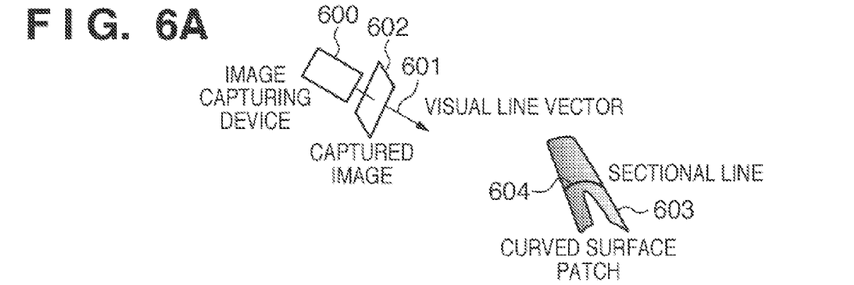
FIGS. 6A to 6C are views associated with determination of geometric features according to the first embodiment.
Figure 6B:
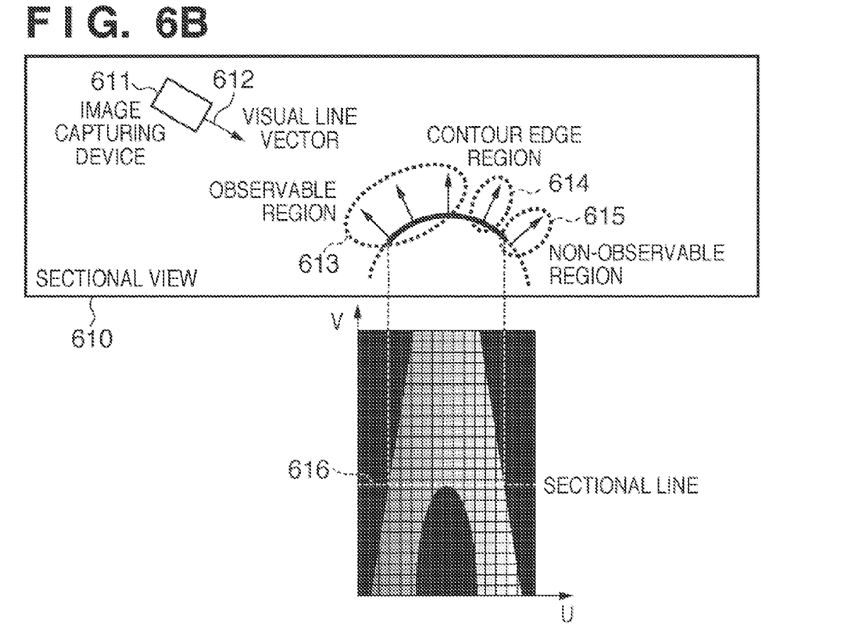

A mechanism for extracting a geometric feature on each curved surface patch based on the observation direction of the measurement object will be described below with reference to FIGS. 6A to 6C. FIG. 6A shows a state in which one curved surface patch is captured from a certain observation direction by an image capturing device 600. FIG. 6B is a sectional view of the state in FIG. 6A taken along a sectional line 604.

Figure 6C:
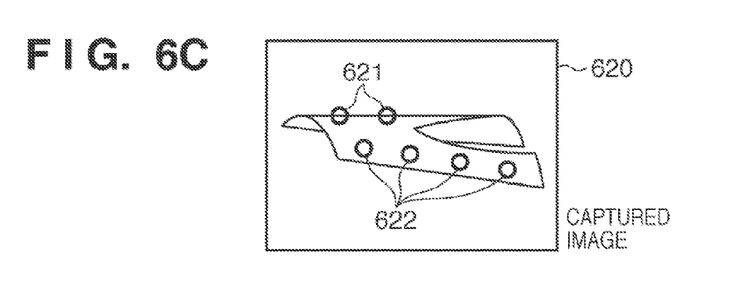

FIG. 6C shows a captured image 620 at that time. Letting θ be an angle a normal vector of a curved surface and the visual line vector make with each other (0°≤θ≤180°), a region 622 in which the obverse side of an object curved surface is observable in the captured image 620 corresponds to a region 613 which satisfies θ>90°. By contrast, as for a contour edge region 614 and non-observable region 615, which satisfy θ≤90°, the edge and reverse side of the curved surface patch are observed, and the obverse side of the curved surface is not observed. Hence, using an inner product n·e' of the visual line vector e' and the normal vector n of the curved surface associated with each pixel, an angle condition of a region on the curved surface patch, which is observable in the observation direction, is determined on the normal map. More specifically, the inner product n·e' is calculated by:

$$n \cdot e = n_x \cdot e'_x + n_y \cdot e'_y + n_z \cdot e'_z \quad (4)$$

A certain threshold is set for the inner product n·e' calculated using this equation (4) in advance so as to determine a region whose obverse surface is observable in a direction vector, and pixels (u, v) which meet a given condition are determined as an observable local region on the captured image. This condition is given by:

$$n \cdot e' < \text{threshold} \quad (5)$$

As this threshold, a sufficiently small value is used. By determining observable feature regions using inequality (5) above based on the visual line vector of the image capturing device, geometric features, which change depending on the positional relationship between the image capturing device and measurement object, can be extracted from the parametric shape model at high speed and accuracy.

After the feature regions are selected, as described above, in step S205 in FIG. 2, the geometric feature calculation unit 105 calculates coordinates (x, y, z) of a point on a curved surface which corresponds to each pixel (u, v) in the normal map determined as an observable local region. The point whose coordinates are calculated in this step is associated with a geometric feature on the captured image, and is used in position/orientation estimation processing.

In step S206, the image input unit 106 captures a range image which stores depth information from the distance sensor, and inputs the captured range image to the three-dimensional measurement apparatus 109.

In step S207, the correspondence search unit 107 associates the geometric features calculated in step S205 with those on the range image captured in step S206, and outputs associated pairs of the geometric features of the shape model and those on the range image.

In step S208, the position/orientation calculation unit 108 updates the position and orientation of the measurement object by a nonlinear optimization method.

In step S209, convergence determination is executed. If values are converged, the processing ends; otherwise, the process returns to step S203. The convergence determination uses a difference between square sums of error vectors before and after update processing of the position and orientation in determination.

As described above, according to the first embodiment, normal maps are generated for respective curved surface patches, and geometric features required to be associated with those on the range image in the position/orientation estimation processing can be extracted at high speed based on the inner products of the observation direction of the measurement object and normal directions.

Second Embodiment

In the first embodiment, the inner product n·e' of the visual line vector of the image capturing device and the normal to each curved surface patch is calculated, and a pixel having a value n·e' smaller than the certain threshold is determined as that of an observable plane region on an image and is extracted as a geometric feature which is valid in registration with a range image. However, a region where the normal vector is perpendicular to the visual line vector corresponds to a contour edge region 614, as shown in FIG. 6B. Therefore, the contour edge region may be used as an edge geometric feature which is valid in registration with a two-dimensional image. More specifically, a threshold which is an arbitrary small value is set, and a pixel which satisfies a given condition is determined as that of a contour edge region. This condition is given by:

$$|n \cdot e'| < \text{threshold} \quad (6)$$

After that, the coordinates (x, y, z) of a point on the curved surfaces are calculated for the pixel which is determined as that of the contour edge region by the same processing as in step S205. The point whose coordinates are calculated in this process is associated with a geometric feature on a captured image and is used in the position/orientation estimation processing. More specifically, the points on the geometric features of the shape model are projected onto a two-dimensional image, and geometric features corresponding to surrounding regions of the projected points are searched on the two-dimensional image, thereby associating the geometric features of the shape model with those on the two-dimensional image.

Furthermore, as a practical position/orientation calculation method, iterative optimization operations can be made using, as an evaluation function, a sum total of distances on the two-dimensional image of the associated pairs of the geometric features of the shape model and those on the two-dimensional image.

Alternatively, signs of n·e' of four neighboring pixels (u−1, v−1), (u, v−1), (u−1, v), and (u, v) on each normal map may be taken into consideration. That is, it may be determined that a contour edge region exists in a region where the signs of the inner products are switched, and a pixel (u', v') as a contour edge may be calculated by interpolation of the inner products of the four pixels. More specifically, when the inner products of pixels included in a single row have the same sign, and those of two rows have different signs, it is determined that a contour edge exists between the rows. At this time, a pixel whose sign=0 is interpolated from the inner product values of the respective pixels, thus calculating a pixel (u', v') as a contour edge and the direction of the edge. In this case, the contour edge on a surface patch can be detected as an edge line segment based on the coordinates of points and the direction of the edge. Therefore, the coordinates of the points as the contour edges on the shape model and directions of the edges are projected onto the two-dimensional image, and geometric features corresponding to directions perpendicular to the projected edge line segments are linearly searched, thereby associating the geometric features of the shape model with those on the two-dimensional image. The subsequent position/orientation estimation processing can be similarly executed by the method described in the first embodiment.

Third Embodiment

In the first embodiment, the visual line vector of a captured image is calculated based on the observation direction of the measurement object, and geometric features are determined based on the inner products of normal maps of respective curved surface patches and the visual line vector. However, a direction vector to each pixel of a captured image may be calculated based on the observation direction of the image capturing device, and may be used in place of the visual line vector. More specifically, for each pixel (u, v) of a normal map, the coordinates (x, y, z) of a point on a corresponding curved surface are calculated together with a normal n=(nx, ny, nz)$^T$, and are held in association with the normal. The feature region selection unit 104 projects the calculated point onto a captured image based on the approximate position and orientation of the image capturing device and the camera intrinsic parameters, and calculates image coordinates of the projected point. Next, the feature region selection unit 104 calculates a direction vector to the image coordinates of the projected point to convert the coordinates into those on the model coordinate system. Then, the feature region selection unit 104 calculates the inner product of the direction vector to the image coordinates at which the point on the curved surface is projected, and the normal vector of the projected point on the curved surface, so as to determine a geometric feature region by the same method as in the first embodiment. In this example, since a direction vector to a pixel corresponding to a point on each curved surface projected onto an image is used in place of the visual line vector, an observable geometric feature on the captured image can be determined more accurately. Furthermore, since not only a normal to a point on a curved surface but also the coordinates of the point on the curved surface are calculated in advance, the need for coordinate calculation processing of the point at the time geometric feature extracting processing can be obviated, and geometric features can be extracted at higher speed. However, the method of calculating a correspondence between the direction vector and normal vector is not limited to this. For example, a Bounding box which covers a curved surface patch is set for each patch, and intersection determination between direction vectors to respective pixels and the Bounding Boxes is executed. After that, geometric feature regions may be determined based on the inner products of normal vectors of the curved surface patch corresponding to the intersecting Bounding Boxes and the intersecting direction vectors. Alternatively, the barycentric coordinates of each curved surface patch may be calculated, and may be projected as representative coordinates in place of the coordinates of points on the curved surface. In addition, any other methods may be used as long as they calculate correspondences between normal vectors to points on respective curved surface patches and a vector that represents the observation direction.

Fourth Embodiment

In the first embodiment, the image resolution, that is, the size of the normal map of each curved surface patch is decided according to a relative area ratio of curved surface patches in the model. However, in addition, the image resolutions of the normal maps to be used may be switched in consideration of a viewpoint of a captured image. More specifically, the resolutions of the normal maps of the curved surface patches are hierarchically set to generate a plurality of sets of resolutions. Then, when the distance between the measurement object and image capturing device is large based on the approximate position and orientation of the image capturing device input from the observation direction input unit 103, geometric features are determined using normal maps having a low resolution. In this way, in case of a far viewpoint, the processing load is reduced using low-resolution normal maps generated by coarse sampling, and geometric features can be calculated at high speed. On the other hand, in case of a near viewpoint, geometric features can be accurately calculated based on high-resolution normal maps generated by fine sampling.

Fifth Embodiment

The first embodiment has explained the case in which geometric features used in the position/orientation estimation processing are extracted from the parametric shape model at high speed based on the observation direction. The fifth embodiment will explain a case in which curvatures of points on curved surfaces extracted from a parametric shape model in observation images of a large number of different viewpoints are calculated in advance, and a measurement object is "recognized" from a range image using the curvatures. Note that "recognition" means to detect an object included in a captured image, and to calculate an approximate position and orientation of that object.

Figure 7:
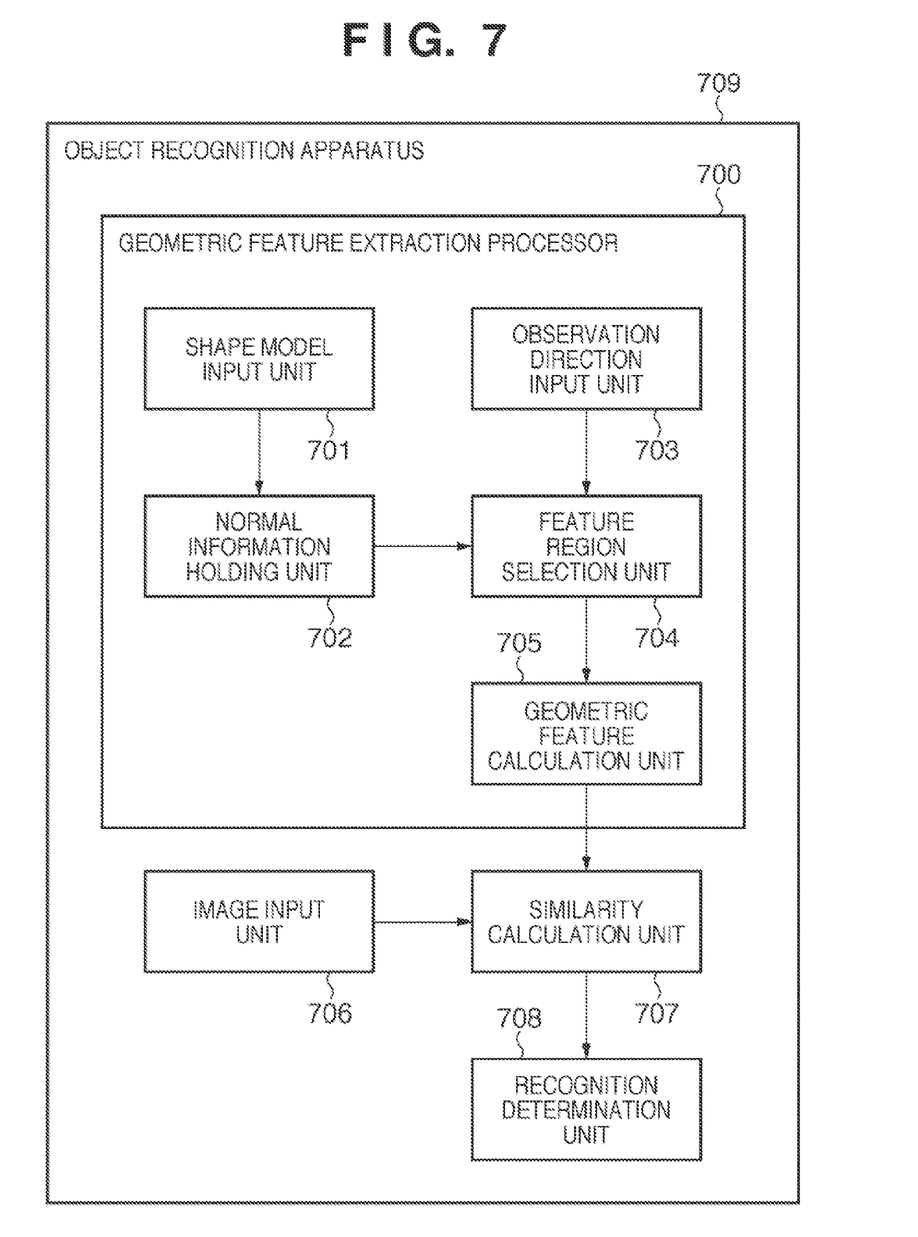
FIG. 7 is a block diagram showing the arrangement of a geometric feature extraction processor 700 and an object recognition apparatus 709 according to the fifth embodiment.

The arrangement of a geometric feature extraction processor 700 and object recognition apparatus 709 according to the fifth embodiment will be described below with reference to FIG. 7. The geometric feature extraction processor 700 has the same arrangement as that of the geometric feature extraction processor 100 in the first embodiment, and includes a shape model input unit 701, normal information holding unit 702, observation direction input unit 703, feature region selection unit 704, and geometric feature calculation unit 705. The object recognition unit 709 includes the geometric feature extraction processor 700, an image input unit 706, a similarity calculation unit 707, and a recognition determination unit 708. Respective processing units which configure the geometric feature extraction processor 700 and object recognition apparatus 709 will be described below. Note that the shape model input unit 701, normal information holding unit 702, feature region selection unit 704, and image input unit 706 are the same as the corresponding processing units of the first embodiment, and a description thereof will not be repeated.

The observation direction input unit 703 inputs an observation direction upon capturing an image of a measurement object. Note that the observation direction means a direction from a certain viewpoint to the measurement object. In the object recognition, in order to calculate the position and orientation of an object, a plurality of images obtained by observing a target object from a plurality of viewpoints are held in advance as a database. Then, similarities of geometric features between the plurality of images in the database and an input image are determined to select an image having a highest similarity, thereby recognizing the approximate position and orientation of the object. The observation direction input unit 703 inputs an approximate position and orientation at the observation timing as a viewpoint upon observing the measurement object, so as to generate a plurality of observation images held as the database. In general, a polyhedron like a Geodesic dome having a certain size that covers the measurement object is assumed, and respective vertices of the polyhedron are set as viewpoints upon observing the measurement object. However, the viewpoint setting method is not limited to this. For example, in another method, a sphere having a certain size that covers the measurement object may be assumed, latitudes and longitudes may be assigned to the sphere like a globe, and viewpoints may be set at equal intervals in latitude and longitude directions. In addition, any other methods may be used as long as they can set observation viewpoints valid for the object recognition.

The geometric feature calculation unit 705 derives geometric features used in the object recognition for points on curved surfaces used as observable regions selected by the feature region selection unit 704. More specifically, the geometric feature calculation unit 705 derives Gaussian curvatures, principal curvatures, and average curvatures using the coordinates (x, y, z) and normals $(nx, ny, nz)^T$ of respective points on curved surfaces corresponding to neighboring pixels on normal maps by a method described in [Paul J. Besl, "Surfaces in Range Image Understanding" Springer-Verlag, pp. 63-115, 1988]. However, the geometric features to be derived are not limited to the Gaussian curvatures. For example, the geometric features to be derived may be contour edges calculated in the first embodiment. After that, the calculated geometric features are registered in association with corresponding pixels (u, v).

The similarity calculation unit 707 calculates similarities between the geometric features calculated by the geometric feature calculation unit 705 and those on an image input by the image input unit 706. More specifically, the similarity calculation unit 707 calculates geometric features of respective pixels calculated by the geometric feature calculation unit 705 for respective blocks obtained by dividing an image into partial regions. Then, the similarity calculation unit 707 calculates differences between the geometric features of respective pixels in each block region and those of pixels of a block which exists on the same region on an input image.

The recognition determination unit 708 outputs an object included in the captured image and its approximate position and orientation by outputting an image having a highest similarity of those between a large number of images in the database and the input image, which are calculated by the similarity calculation unit 707.

Figure 8:
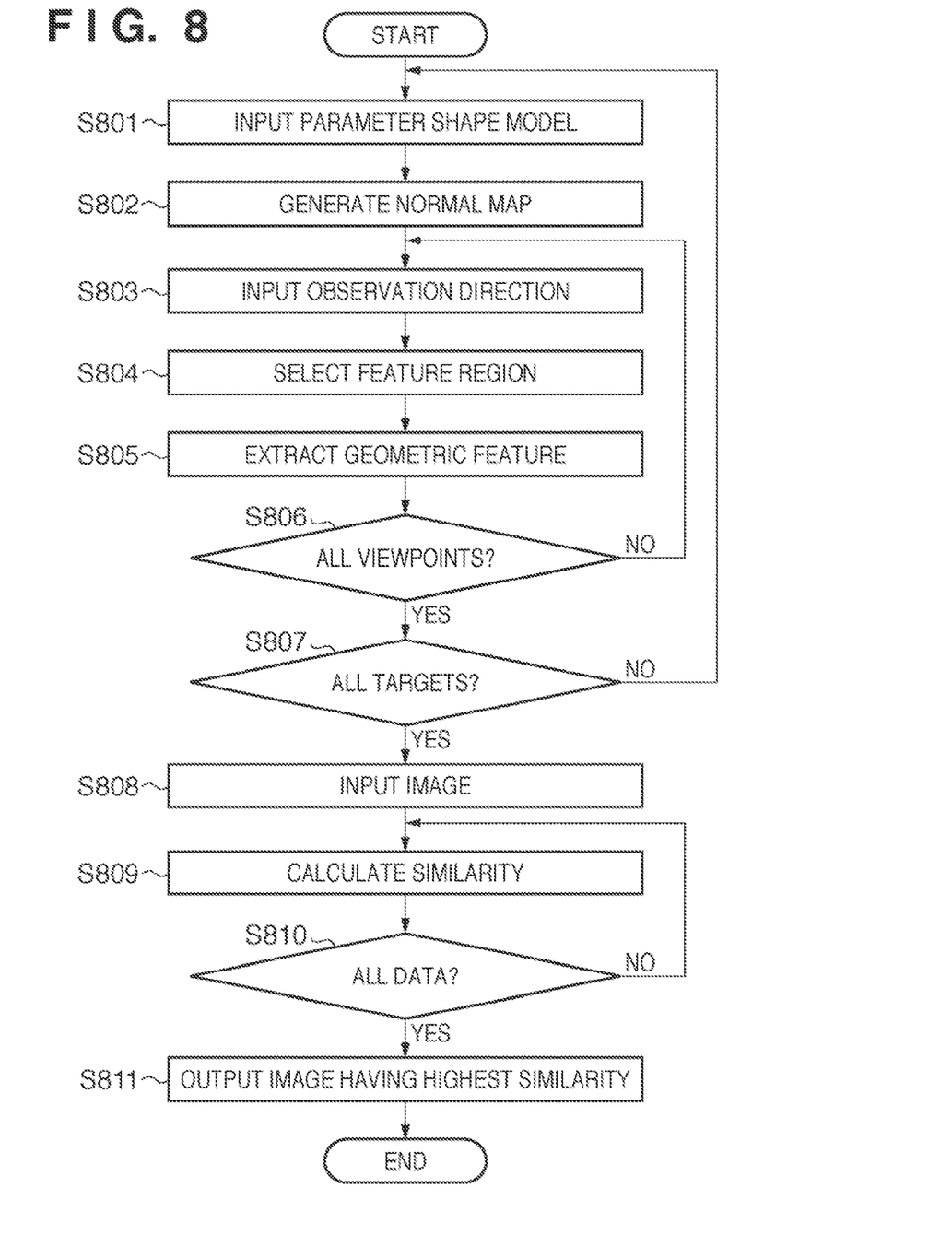
FIG. 8 is a flowchart showing the sequence of geometric feature extracting processing according to the fifth embodiment.

The flowchart showing the processing sequence for extracting geometric features from a parametric shape model of the measurement object according to the fifth embodiment will be described below with reference to FIG. 8. Note that step S801 is the same as the first embodiment, and a description thereof will not be repeated.

In step S802, normal map images are generated for respective curved surface patches of a parametric shape model input in step S801. Since the basic processing is the same as step S202 described in the first embodiment, a description thereof will not be given. Note that in this embodiment, the coordinates (x, y, z) of points on corresponding curved surfaces are derived in addition to normals $n=(nx, ny, nz)^T$, and are held in association with respective pixels (u, v) as in the third embodiment.

In step S803, the observation direction input unit 703 inputs the observation direction of the measurement object to the geometric feature extraction processor 700.

In step S804, feature regions which are valid in recognition are selected from an observation image of the parametric shape model in the input observation direction. More specifically, the coordinates (x, y, z) of points on the curved surfaces calculated in step S802 are projected onto a captured image based on the observation direction and camera intrinsic parameters to calculate image coordinates, thereby calculating direction vectors to the respective projected pixels by the same method as in the third embodiment. In this case, the inner products of the normals to the points on the curved surfaces and the direction vectors to the pixels onto which the points are projected are calculated, and observable points on the image are calculated by the same method as in the first embodiment.

In step S805, the geometric feature calculation unit 705 derives and holds Gaussian curvatures or average curvatures for respective pixels of an observation image at each viewpoint. More specifically, the geometric feature calculation unit 705 uses the coordinates (x, y, z) and normals $(nx, ny, nz)^T$ of points on a curved surface respectively corresponding to neighboring pixels on a uv plane for pixels (u, v) of a region, which is determined as an observable region. Then, the geometric feature calculation unit 705 derives and holds Gaussian curvatures or average curvatures for respective pixels of an observation image at each viewpoint.

It is checked in step S806 if processing is complete for all set viewpoints. If the processing is not complete for all viewpoints yet (NO in step S806), the process returns to step S803; otherwise (YES in step S806), the process advances to step S807.

It is checked in step S807 if processing is complete for all objects to be recognized. If the processing is not complete for all objects yet (NO in step S807), the process returns to step S801; otherwise (YES in step S807), the process advances to step S808.

In step S808, the image input unit 706 inputs a captured image.

In step S809, the similarity calculation unit 707 calculates similarities of geometric features between the database of the geometric features in observation images at a large number of viewpoints of a large number of objects, which are generated in step S805, and the input image.

It is checked in step S810 if similarities have been calculated for all database data. If similarities have not been calculated for all database data yet (NO in step S810), the process returns to step S809; otherwise (YES in step S810), the process advances to step S811.

In step S811, an object included in the captured image and its approximate position and orientation are output by outputting an image having the highest similarity of those for images in the database calculated in step S810.

As described above, according to this embodiment, the curvatures of points on observable curved surface patches can be extracted from observation images in a large number of different observation directions, and can be used in object recognition.

According to the present invention, by controlling the density of corresponding points used in position/orientation measurement processing in accordance with distance measurement errors, the processing speed can be improved while suppressing a position/orientation measurement accuracy drop.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable storage medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-059923 filed on Mar. 16, 2010, which is hereby incorporated by reference herein in its entirety.

The invention claimed is:

1. A geometric feature extracting device comprising:
a first input unit configured to input a three-dimensional shape model of a measurement object;
a generation unit configured to generate two-dimensional parameter planes corresponding to curved surface patches that configure the three-dimensional shape model;
a first calculation unit configured to calculate normal directions to points on the curved surface patches;
a holding unit configured to hold the parameter planes and the normal directions in association with each other;
a second input unit configured to input an observation direction used to observe the measurement object from an observation position;
a selection unit configured to select regions in each of which the normal direction and the observation direction satisfy a predetermined angle condition from the parameter planes; and
a second calculation unit configured to calculate geometric features on the three-dimensional shape model corresponding to the regions selected by said selection unit as geometric features that configure geometric feature regions on the three-dimensional shape model, which are observable from the observation position.

2. The device according to claim 1, wherein the angle condition is that an inner product of unit vectors of the normal direction and the observation direction is smaller than a threshold.

3. The device according to claim 1, wherein said holding unit holds coordinates of the points together with the normal vectors to the points of the three-dimensional shape model.

4. The device according to claim 1, wherein said second calculation unit calculates curvatures of surfaces as geometric features of the regions selected by said selection unit.

5. The device according to claim 1, wherein the angle condition is that the absolute value of the inner product of unit vectors of the normal direction and the observation direction is smaller than a threshold.

6. A three-dimensional measurement apparatus comprising:
the geometric feature extracting device according to claim 1;
a third input unit configured to input an image of the measurement object that is observed from the observation position;
an association unit configured to associate the geometric feature of the image inputted from the third input unit with the geometric feature calculated by the second calculation unit; and
an estimation unit configured to estimate a position and orientation of the measurement object based on the result of the association.

7. An object recognition apparatus comprising:
the geometric feature extracting device according to claim 1;
a third input unit configured to input an image of the measurement object that is observed from the observation position;
a fourth calculation unit configured to calculate a similarity between the geometric feature of the image inputted from the third input unit and each geometric feature of a plurality of objects calculated by the second calculation unit; and
a recognition unit configured to recognize the measurement object based on the similarity.

8. The object recognition apparatus according to claim 7, wherein the fourth calculation unit calculates the similarity between the geometric feature of the image inputted from the third input unit and each geometric feature of a plurality of viewpoints of a plurality of objects calculated by the second calculation unit; and
the recognition unit recognize the measurement object, and the position and orientation of the measurement object, based on the similarity.

9. A geometric feature extracting method using a computer to perform steps comprising:
a first input step of inputting a three-dimensional shape model of a measurement object;
a generation step of generating, using a processor, two-dimensional parameter planes corresponding to curved surface patches that configure the three-dimensional shape model;
a first calculation step of calculating, using the processor, normal directions to points on the curved surface patches;
a holding step of holding, in a memory, the parameter planes and the normal directions in association with each other;
a second input step of inputting an observation direction used to observe the measurement object from an observation position;

a selection step of selecting regions in each of which the normal direction and the observation direction satisfy a predetermined angle condition from the parameter planes; and a second calculation step of calculating, using the processor, geometric features on the three-dimensional shape model corresponding to the regions selected in the selection step as geometric features that configure geometric feature regions on the three-dimensional shape model, which are observable from the observation position.

10. A computer-readable storage medium storing a computer program for controlling a computer to execute respective steps of a geometric feature extracting method according to claim 9.

* * * * *